United States Patent
Tachibana

(10) Patent No.: US 8,735,717 B2
(45) Date of Patent: May 27, 2014

(54) THIN FILM SOLAR CELL AND METHOD OF MANUFACTURING THE SAME

(75) Inventor: Shinsuke Tachibana, Osaka (JP)

(73) Assignee: Sharp Kabushiki Kaisha, Osaka (JP)

(*) Notice: Subject to any disclaimer, the term of this patent is extended or adjusted under 35 U.S.C. 154(b) by 762 days.

(21) Appl. No.: 12/664,209

(22) PCT Filed: Apr. 25, 2008

(86) PCT No.: PCT/JP2008/058028
§ 371 (c)(1),
(2), (4) Date: Dec. 11, 2009

(87) PCT Pub. No.: WO2008/152865
PCT Pub. Date: Dec. 18, 2008

(65) Prior Publication Data
US 2010/0163106 A1 Jul. 1, 2010

(30) Foreign Application Priority Data
Jun. 12, 2007 (JP) ................... 2007-155390

(51) Int. Cl.
*H01L 31/00* (2006.01)
(52) U.S. Cl.
USPC ......................................... 136/256; 136/252
(58) Field of Classification Search
USPC .................................................. 136/252, 256
See application file for complete search history.

(56) References Cited

U.S. PATENT DOCUMENTS

| 5,674,325 | A * | 10/1997 | Albright et al. | 136/250 |
| 6,414,397 | B1 * | 7/2002 | Sawamoto | 257/783 |
| 6,471,816 | B1 * | 10/2002 | Shuto et al. | 156/256 |
| 2005/0115602 | A1 * | 6/2005 | Senta et al. | 136/250 |

FOREIGN PATENT DOCUMENTS

| JP | 7-147424 | 6/1995 |
| JP | 2002-314104 | 10/2002 |
| JP | 2002314104 A * | 10/2002 |
| JP | 2004-193317 | 7/2004 |
| JP | 2005-101519 | 4/2005 |
| JP | 2005167161 A * | 6/2005 |

OTHER PUBLICATIONS

English machine translation of JP2002-314104A.*
Technical Data sheet for 3M Electrically conductive adhesive transfer tape 9703. Apr. 2011.*
English machine translation of JP2005-167161A.*
International Search Report for PCT/JP2008/058028, mailed Aug. 5, 2008.

* cited by examiner

*Primary Examiner* — Jonathan Johnson
*Assistant Examiner* — Lindsey Bernier
(74) *Attorney, Agent, or Firm* — Nixon & Vanderhye, P.C.

(57) ABSTRACT

A highly reliable thin film solar cell and a method of manufacturing the same are provided to improve bonding strength between a back-surface electrode layer and a bus bar without limiting the kind of metal film of the back-surface electrode layer. The thin film solar cell at least includes a light-transmitting insulating substrate, a transparent conductive film, a photoelectric conversion layer, and a back-surface electrode layer provided on the light-transmitting insulating substrate, and a bus bar provided on the back-surface electrode layer. The bus bar is electrically connected with the back-surface electrode layer with a conductive tape interposed whereby the back-surface electrode layer is used as a take-out electrode. The conductive tape preferably includes a thermosetting resin and a conductive particle. Furthermore, the conductive tape is preferably an anisotropic conductive tape.

6 Claims, 4 Drawing Sheets

THIN FILM SOLAR CELL AND METHOD OF MANUFACTURING THE SAME

This application is the U.S. national phase of International Application No. PCT/JP2008/058028 filed 25 Apr. 2008, which designated the U.S. and claims priority to Japan Application No. 2007-155390 filed 12 Jun. 2007, the entire contents of each of which are hereby incorporated by reference.

TECHNICAL FIELD

The present invention relates to a thin film solar cell and a method of manufacturing the same, and more particularly to a highly reliable thin film solar cell having excellent bonding strength between a back-surface electrode layer and a bus bar and a method of manufacturing the same.

BACKGROUND ART

Conventionally, as a thin film solar cell, there has been proposed an integrated thin film solar cell including a transparent conductive film such as ZnO, ITO, or $SnCl_2$ formed on a light-transmitting insulating substrate made of glass or the like, a photoelectric conversion layer formed thereon by successively stacking a p-layer, an i-layer, an n-layer of thin film semiconductor such as amorphous silicon, and stacks of back-surface electrode layers of ZnO/Ag, for example, formed thereon in series, in parallel, or in series and parallel. For example, Patent Document 1 (Japanese Patent Laying-Open No. 2002-314104) proposes that a bus bar coupled to a back-surface electrode layer through a conductive paste is used as an electrode portion for taking out output of a thin film solar cell.

Patent Document 1: Japanese Patent Laying-Open No. 2002-314104

DISCLOSURE OF THE INVENTION

Problems to be Solved by the Invention

The adhesion between aluminum and solder is generally poor. In a case where aluminum is used for a back-surface electrode layer, good adhesion between aluminum and solder can be provided only with the use of special solder. For example, the technique of Patent Document 1 has a problem in that the good adhesion between aluminum and solder is hardly achieved when the thickness of aluminum is small. Furthermore, it is desired to enhance bonding strength even in a case where a metal other than aluminum is used for the back-surface electrode layer.

An object of the present invention is to solve the problem of the conventional technique as described above and to provide a highly reliable thin film solar cell and a method of manufacturing the same to allow improvement of bonding strength between a back-surface electrode layer and a bus bar without limiting the kind of metal film of the back-surface electrode layer.

Means for Solving the Problems

The present invention provides a thin film solar cell including a light-transmitting insulating substrate, a transparent conductive film, a photoelectric conversion layer, and a back-surface electrode layer provided on the light-transmitting insulating substrate, and a bus bar provided on the back-surface electrode layer, wherein the bus bar is electrically connected with the back-surface electrode layer with a conductive tape interposed whereby the back-surface electrode layer is used as a take-out electrode.

In the thin film solar cell of the present invention, preferably, the conductive tape includes a thermosetting resin and a conductive particle.

In the thin film solar cell of the present invention, preferably, the conductive tape is an anisotropic conductive tape.

In the thin film solar cell of the present invention, preferably, the conductive tape is arranged in a dotted manner.

In the thin film solar cell of the present invention, preferably, the width of the conductive tape is made smaller than the width of the bus bar.

In the thin film solar cell of the present invention, preferably, the bus bar is formed of a conductor of a metal foil coated with plating.

In the thin film solar cell of the present invention, preferably, a flatness of that surface of the bus bar which is connected with the conductive tape is less than or equal to 10 µm.

The present invention also provides a manufacturing method for obtaining any thin film solar cell as described above. The method of manufacturing the thin film solar cell includes the steps of: forming the transparent conductive film, the photoelectric conversion layer, and the back surface electrode layer in this order on the light-transmitting insulating substrate; and bonding the bus bar onto the back-surface electrode layer with the conductive tape interposed. The bonding is performed by provisional compression-bonding of the conductive tape and main compression-bonding following the provisional compression-bonding.

In the method of manufacturing the thin film solar cell in the present invention, preferably, the bonding is performed using a pulse heater.

Effects of the Invention

In accordance with the present invention, it becomes possible to provide a reliable thin film solar cell and a method of manufacturing the same to allow improvement of bonding strength between a back-surface electrode layer and a bus bar without limiting the kind of metal film of the back-surface electrode layer.

DESCRIPTION OF THE REFERENCE SIGNS

1 light-transmitting insulating substrate, 2 transparent conductive film, 3 photoelectric conversion layer, 4 back-surface electrode layer, 5, 7 separation line, 6 contact line, 8 conductive tape, 9 conductor, 10 plating, 11 bus bar, 12 thin film solar cell, 13 adhesive material, 14 back-surface sealing material, 15 back-surface electrode layer, 16, 17 region, 18 base line.

BEST MODES FOR CARRYING OUT THE INVENTION

A thin film solar cell of the present invention includes a light-transmitting insulating substrate, a transparent conductive film, a photoelectric conversion layer, and a back-surface electrode layer provided on the light-transmitting insulating substrate, and a bus bar provided on the back-surface electrode layer. The bus bar is electrically connected with the back-surface electrode layer with a conductive tape interposed whereby the back-surface electrode is used as a take-out electrode.

Figure 1:
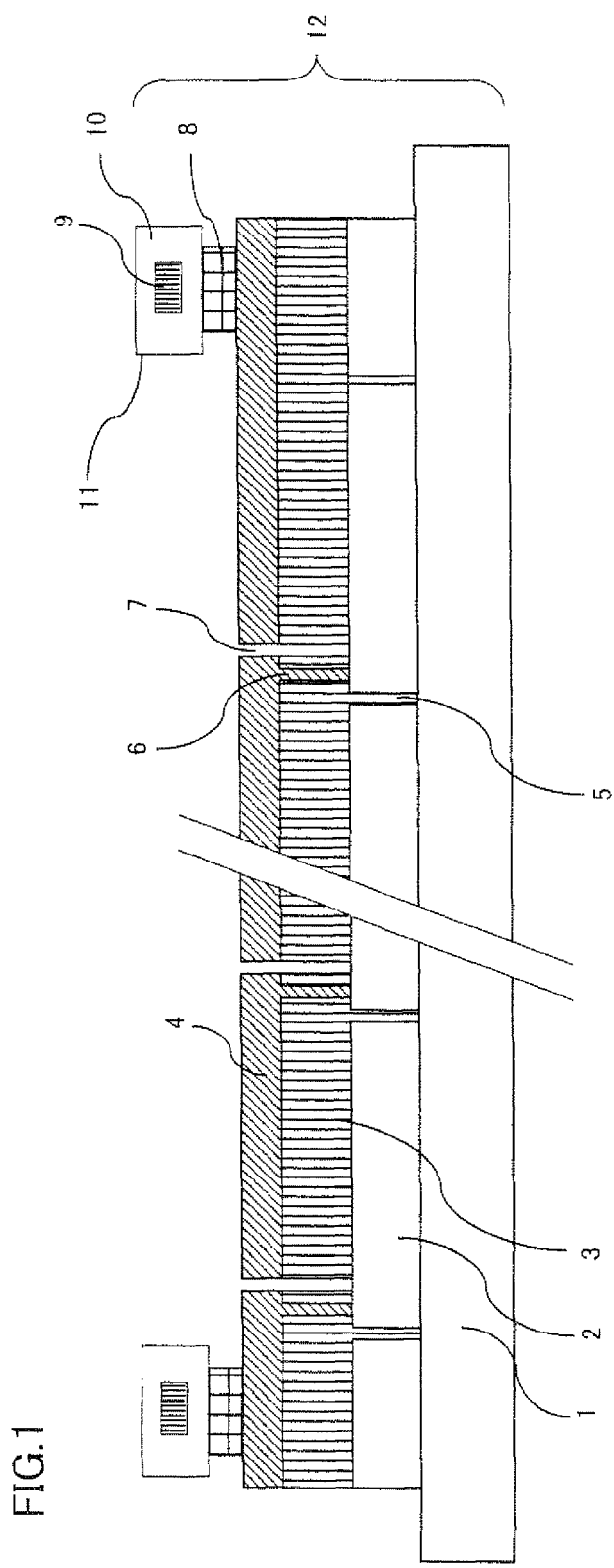
FIG. 1 is a cross-sectional view showing an exemplary structure of a thin film solar cell in accordance with the present invention.

FIG. 1 is a cross-sectional view showing an exemplary structure of a thin film solar cell in accordance with the present invention. In a thin film solar cell 12 shown in FIG. 1, a transparent conductive film 2, a photoelectric conversion layer 3, and a back-surface electrode layer 4 are provided on a light-transmitting insulating substrate 1, and a bus bar 11 is electrically connected with back-surface electrode layer 4 with a conductive tape 8 interposed. In the present invention, the use of a conductive tape for bonding the back-surface electrode layer with the bus bar allows the back-surface electrode layer and the bus bar to be bonded together well without depending on the kind of metal film forming the back-surface electrode layer. This ensures good and stable conductivity between the back-surface electrode layer and the bus bar thereby providing a highly reliable thin film solar cell.

The use of a conductive tape also ensures good adhesion with a simple manufacturing process, and therefore in accordance with the present invention, the costs for manufacturing a thin film solar cell can be kept low.

A conductive tape including a thermosetting resin and a conductive particle may preferably be used, in that the effect of improving bonding strength between the back-surface electrode layer and the bus bar is particularly great without depending on the kind of metal film of the back-surface electrode layer. An example of a preferable thermosetting resin is the one having a setting temperature in a range of 150-250° C. When the setting temperature of the thermosetting resin is 150° C. or higher, the physical strength of the conductive tape portion is high and the reliability of the thin film solar cell is particularly good. When 250° C. or lower, the conductive tape and the back-surface electrode layer or the bus bar are hardly separated from each other and the reliability of the thin film solar cell is particularly good. An example of a more preferable thermosetting resin is a resin that hardens for a few seconds at a setting temperature in a range of 150-250° C.

Specific examples of the preferable thermosetting resin are those based on epoxy resin, acrylic resin, or the like.

Examples of a preferable conductive particle are, for example, a nickel particle, a nickel particle plated with gold or the like, and so on. The mean particle size of the conductive particle is preferably, for example, in a range of 3-10 μm. When the flatness of that surface of the bus bar which is connected with the conducive tape is not good, a conductive tape including a conductive particle having a larger particle size is preferably used.

The thickness of the conductive tape is preferably, for example, in a range of 20-40 μm. When the thickness of the conductive tape is 20 μm or more, stable adhesion between the back-surface electrode layer and the bus bar can be obtained. When 40 μm or less, the condition setting at the time of bonding can be controlled easily, and in addition, an increase in manufacturing costs can be prevented.

The conductive tape is preferably an anisotropic conductive tape. Here, an anisotropic conductive tape means a tape exhibiting electrical anisotropy of being conductive in a thickness direction and being insulating in a plane direction of a compression-bonded portion. When an anisotropic conductive tape is used, the effect of achieving good adhesion between the back-surface electrode layer and the bus bar is particularly good without depending on the kind of metal film of the back-surface electrode layer.

The tensile strength in the horizontal direction (that is, the direction vertical to the thickness direction) of the conductive tape is preferably 166 N/cm$^2$ or more, and in that case, the reliability of the thin film solar cell is particularly good. The tensile strength at an angle of 45 degrees to the above-noted horizontal direction of the conductive tape is preferably 25 N/cm$^2$ or more, and in that case, the reliability of the thin film solar cell is particularly good, too.

Figure 2:
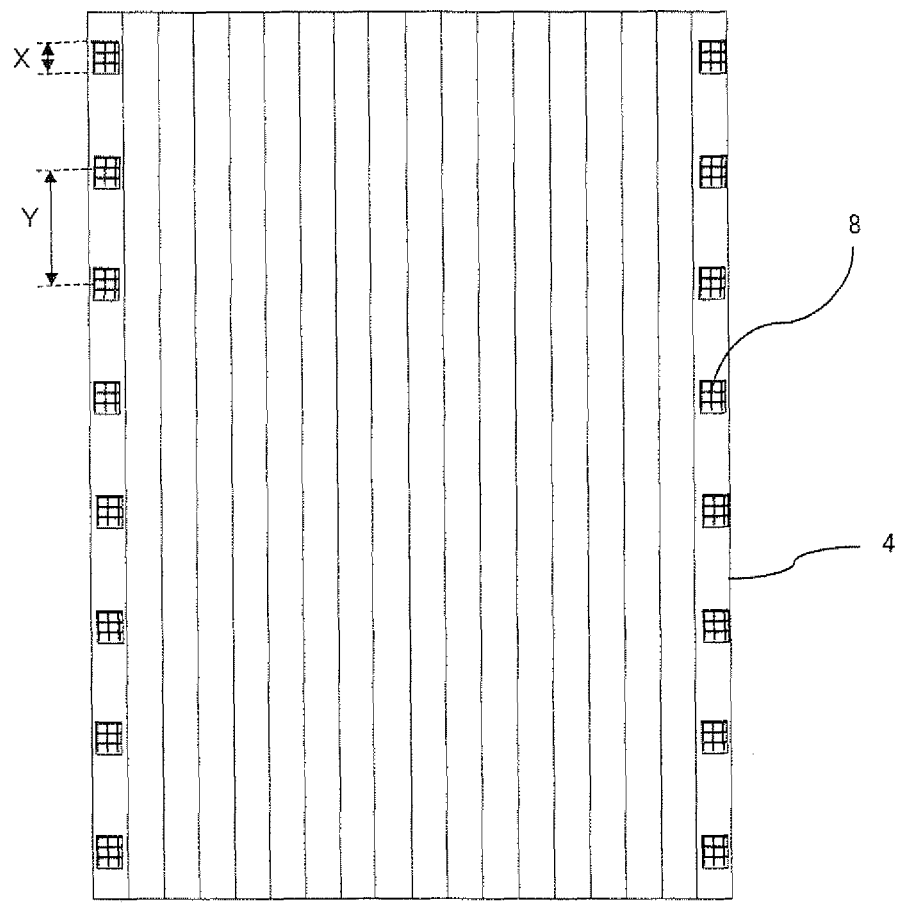
FIG. 2 is a plan view showing an example of arrangement of a conductive tape in accordance with the present invention.

The conductive tape is preferably arranged in a dotted manner, and in that case, the manufacturing costs can be reduced more without impairing the reliability of the thin film solar cell. FIG. 2 is a plan view showing an example of arrangement of the conductive tape in the present invention. FIG. 2 shows a state in which conductive tapes 8 are formed on back-surface electrode layer 4. FIG. 2 illustrates a case where conductive tapes 8 are arranged on back-surface electrode layer 4 in a dotted manner with a length X and with a pitch Y. In the present invention, length X may be, for example, about 3-8 mm, and pitch Y may be, for example, about 70-150 mm.

In the present invention, the width of the conductive tape is preferably set smaller than the width of the bus bar. In this case, it is possible to prevent the conductive tape from lying off the connection portion between the back-surface electrode layer and the bus bar, thereby to provide a thin film solar cell with a good appearance.

A glass substrate or the like may typically be used as the light-transmitting insulating substrate. A conductive oxide having light-transmitting property, for example, such as ZnO, ITO, or SnO$_2$ may typically be used as the transparent conductive film. The photoelectric conversion layer may be a structure formed by successively stacking a p-layer, an i-layer, and an n-layer made of semiconductor thin films. For example, an amorphous silicon thin film, a crystalline silicon thin film, or a combination thereof may be used as the semiconductor thin film.

As the back-surface electrode layer, for example, the one having a layer made of a conductive oxide such as ZnO and a layer made of a metal such as silver or silver alloy may be used. An example of a more typical back-surface electrode layer is a stack of ZnO/Ag.

Since the back-surface electrode layer and the bus bar are electrically connected with each other through the conductive tape in the present invention, the back-surface electrode layer can be used as a take-out electrode, and even when the thickness of the back-surface electrode layer is relatively small, the back-surface electrode layer and the bus bar can be bonded together well. The thickness of the back-surface electrode layer can be, for example, 500 nm or less, typically in a range of 100-500 nm, and more typically in a range of 125-350 nm.

As the bus bar, typically, the one formed of a conductor of a metal foil coated with plating may preferably be used. Therefore, even a bus bar not including a solder component can be selected, thereby preventing an increase in manufacturing costs. As a material of plating, for example, nickel plating or the like may be employed.

Figure 3:
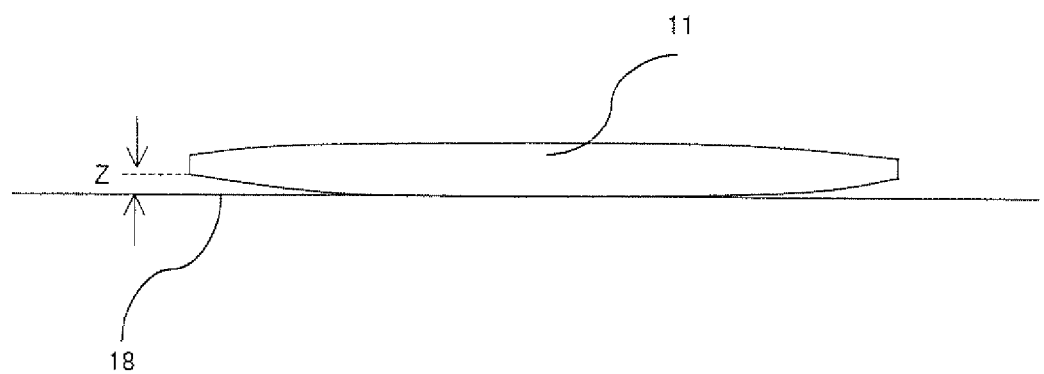
FIG. 3 is a cross-sectional view illustrating a typical shape of a bus bar formed in the thin film solar cell of the present invention.

FIG. 3 is a cross-sectional view illustrating a typical shape of the bus bar formed in the thin film solar cell in the present invention. In that surface of bus bar 11 which is connected with the conductive tape, such slight warpage as a height Z as viewed from a base line 18 may occur. In the present invention, the flatness of that surface of the bus bar which is connected with the conductive tape is preferably 10 μm or less.

Figure 4:
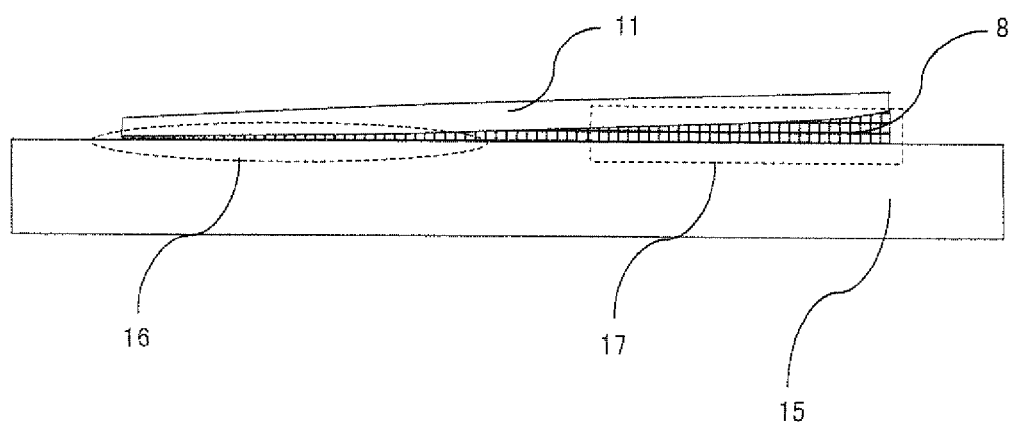
FIG. 4 is a schematic cross-sectional view illustrating a bonding state in a case where that surface of the bus bar which is connected with the conductive tape is not flat.
Figure 5:
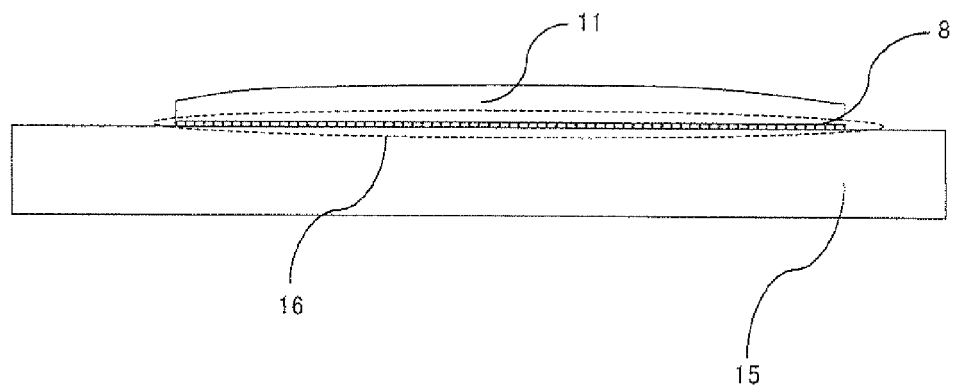
FIG. 5 is a schematic cross-sectional view illustrating a bonding state in a case where that surface of the bus bar which is connected with the conductive tape is flat.

FIG. 4 is a schematic cross-sectional view illustrating a bonding state in a case where that surface of the bus bar which is connected with the conductive tape is not flat, and FIG. 5 is a schematic cross-sectional view illustrating a bonding state in a case where that surface of the bus bar which is connected with the conductive tape is flat. In a case where that surface of the bus bar which is connected with the conductive tape is not flat, as shown in FIG. 4, when bus bar 11 and back-surface electrode layer 15 are bonded together with conductive tape 8 interposed therebetween by the application of pressure in the thickness direction, the conductive tape flows in a region 16 that is pressurized enough to tightly bond bus bar 11 and back-surface electrode layer 15 together. In a region 17 that is not pressured enough, however, a gap is left between conductive tape 8 and bus bar 11 and back-surface electrode layer 15 to reduce the contact surface. Accordingly, the bonding strength may be reduced or the electrical resistance may be increased between the bus bar and the back-surface electrode layer. On the other hand, when that surface of the bus bar which is connected with the conductive tape is flat, as shown in FIG. 5, the pressure in the thickness direction can be exerted evenly, so that the conductive tape flows in region 16 that is pressurized enough over the entire surface of bus bar 11 to tightly bond bus bar 11 and back-surface electrode layer 15 together.

In a case where the flatness of that surface of the bus bar which is connected with the conductive tape is 10 μm or less, when the bus bar and the back-surface electrode layer are bonded together by the conductive tape, even pressure can be applied on the bonded surface in the thickness direction thereby increasing the bonded area. Therefore, the bonding strength between the bus bar and the back-surface electrode layer is good and the electrical resistance is reduced, so that the reliability of the thin film solar cell is particularly good.

It should be noted that the above-noted flatness means a value evaluated, for example, by observing the cross section by a scanning electron microscope.

In order to achieve the above-noted flatness of 10 μm or less, for example, a bus bar formed of a conductor coated with plating may be used, and at least on that surface which is connected with the conductive tape, the plating may be made flat by strictly controlling the plating conditions.

The present invention also provides a manufacturing method for obtaining any thin film solar cell as described above. The method of manufacturing a thin film solar cell includes the steps of: forming a transparent conductive film, a photoelectric conversion layer, and a back-surface electrode layer in this order on a light-transmitting insulating substrate; and bonding a bus bar onto the back-surface electrode layer with a conductive tape interposed, wherein the bonding is performed by provisional compression-bonding of the conductive tape and main compression-bonding following the provisional compression-bonding.

When the bus bar is bonded onto the back-surface electrode layer with a conductive tape interposed, it is advantageous that the bonding is performed by provisional compression-bonding and main compression-bonding following the provisional compression-bonding, in that the back-surface electrode layer and the bus bar can be bonded together precisely without misalignment therebetween.

A typical method of manufacturing a thin film solar cell in the present invention will be described in more detail, taking a thin film solar cell having the structure shown in FIG. 1 as an example. First of all, for example, $SnO_2$ (tin oxide) is formed as transparent conductive film 2 on light-transmitting insulating substrate 1 such as a glass substrate by thermal CVD or the like. Then, transparent conductive film 2 is patterned using the fundamental of YAG laser or the like. Then, transparent conductive film 2 is separated into strips by applying laser light from the glass substrate surface, thereby forming separation lines 5. Thereafter, ultrasonic cleaning by pure water is performed, and photoelectric conversion layer 3 is then formed. As photoelectric conversion layer 3, for example, an upper cell formed of a-Si:Hp layer, a-Si:Hi layer, a-Si:Hn layer and a lower cell formed of μc-Si:Hp layer, μc-Si:Hi layer, μc-Si:Hn layer are deposited.

Then, photoelectric conversion layer 3 is patterned by laser, using the second harmonic generation of YAG laser or $YVO_4$ laser. Photoelectric conversion layer 3 is separated into strips by applying laser light from the glass substrate surface, and a contact line 6 for electrically connecting transparent conductive film 2 with back-surface electrode layer 4 is formed.

Then, ZnO (zinc oxide)/Ag is deposited as back-surface electrode layer 4 by magnetron sputtering or the like. The thickness of ZnO may be about 50 nm. It is noted that in place of ZnO, a film having a high light transmissivity, such as ITO or $SnO_2$ may be used. The thickness of silver may be about 125 nm. It should be noted that while the transparent conductive film such as ZnO as described above may be eliminated in back-surface electrode layer 4, it is preferably provided in order to achieve high conversion efficiency.

Then, back-surface electrode layer 4 is patterned by laser. Back-surface electrode layer 4 is separated in strips by applying laser light from the glass substrate surface, thereby forming separation lines 7. In doing so, for the purpose of avoiding damages to transparent conductive film 2 by laser, the second harmonic generation of YAG laser or the like with good transmissivity through transparent conductive film 2 is preferably used for the laser, and $YVO_4$ laser may be used. Preferably, the process conditions are selected so as to minimize damages to transparent conductive film 2 and to prevent burrs of the silver electrode after back-surface electrode layer 4 being processed.

Then, for example, an anisotropic conductive film (ACF) is used as conductive tape 8 and adhered, for example, in a dotted manner, onto the front surface of back-surface electrode layer 4 where the bus bar is to be formed. It should be noted that a conductive tape including a nickel particle, a gold-plated nickel particle or the like as a metal particle may be used.

Thereafter, bus bar 11 formed of a plated metal foil is laid on back-surface electrode layer 4 with conductive tape 8 adhered thereon and is then provisionally compression-bonded with pressure exerted above from bus bar 11 by performing heating at such a relatively low temperature that does not completely harden the conductive tape. For example, in a case where the conductive tape includes a thermosetting resin and a metal particle, provisional compression-bonding can be performed by heating at a temperature about 70-100° C. lower than the setting temperature of the thermosetting resin. Then, main compression-bonding is preformed with pressure exerted above from bus bar 11 by performing heating at a temperature that hardens the conductive tape. For example, in a case where the conductive tape includes a thermosetting resin and a metal particle, main compression-bonding can be performed by heating at a temperature equal to or higher than the setting temperature of the thermosetting resin. As described above, the thin film solar cell of the present invention can be manufactured.

In the method of manufacturing a thin film solar cell in the present invention, the provisional compression-bonding and the main compression-bonding are preferably performed using a pulse heater. In this case, the control of the heating temperature in accordance with the component material of the conductive tape is easy, and the back-surface electrode layer and the bus bar can bonded together securely with the conductive tape interposed therebetween. Therefore, a highly reliable solar cell can be obtained.

Figure 6:
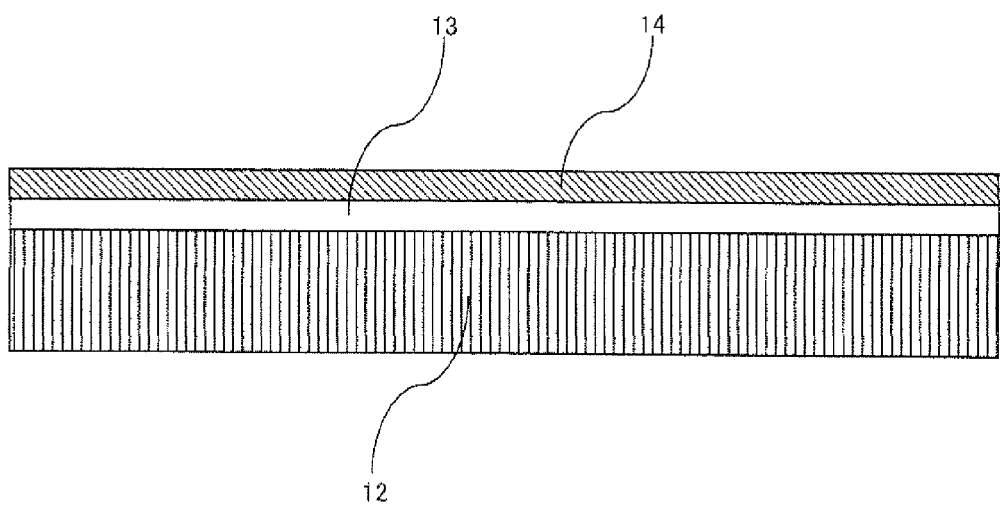
FIG. 6 is a cross-sectional view showing an exemplary usage manner of the thin film solar cell of the present invention.

FIG. 6 is a cross-sectional view showing an exemplary usage manner of the thin film solar cell in the present invention. A back-surface sealing material 14, for example, formed of a laminated film of white PET/aluminum/PET is bonded on the back surface side (that is, the surface side on which the back-surface electrode layer is formed) of thin film solar cell 12 as described above, for example using a vacuum laminating apparatus, with an adhesive material 13 formed of transparent EVA (ethylene vinyl acetate copolymer) or the like, for application to a variety of uses. The thin film solar cell of the present invention may suitably be applied, for example, to such uses as a building-integrated thin film solar cell and a see-through solar cell.

EXAMPLES

In the following, the present invention will be described in more detail with examples. The present invention, however, is not limited thereto.

Example 1

In this example, a thin film solar cell having the structure shown in FIG. 1 was fabricated. A glass substrate having a thickness of about 1.8 mm and a size of 560 mm×925 mm was used as light-transmitting insulating substrate 1, and $SnO_2$ (tin oxide) was deposited by thermal CVD as transparent conductive film 2 on the glass substrate. Then, transparent conductive film 2 was patterned using the fundamental of YAG laser. More specifically, transparent conductive film 2 was separated into strips by applying laser light from the glass substrate surface, thereby forming separation lines 5.

Then, the glass substrate was subjected to ultrasonic cleaning by pure water, and photoelectric conversion layer 3 was thereafter formed. An upper cell formed of a-Si:Hp layer, a-Si:Hi layer, a-Si:Hn layer and a lower cell formed of μc-Si:Hp layer, μc-Si:Hi layer, μc-Si:Hn layer were deposited as photoelectric conversion layer 3. Then, photoelectric conversion layer 3 was patterned using the second harmonic generation of YAG laser. More specifically, photoelectric conversion layer 3 was separated into strips by applying laser light from the glass substrate surface, and contact line 6 was then formed for electrically connecting transparent conductive film 2 and back-surface electrode layer 4 with each other.

Then, ZnO (zinc oxide)/Ag serving as back-surface electrode layer 4 was deposited by magnetron sputtering. Here, the thickness of ZnO was set to 50 nm, and the thickness of silver was set to 125 nm. Then, back-surface electrode layer 4 was patterned by the second harmonic generation of YAG laser. More specifically, back-surface electrode layer 4 was separated in strips by applying laser light from the glass substrate surface, thereby forming separation lines 7.

An anisotropic conductive film (ACF) was used as conductive tape 8. The used ACF was AC-9051AR-35 (manufactured by Hitachi Chemical Co., Ltd., nickel particle). In this example, as shown in FIG. 2, with length X of 5 mm and pitch Y of 125 mm, the conductive tapes were adhered at eight points in a dotted manner at opposite ends of the front surface of back-surface electrode layer 4. Thereafter, bus bar 11 was laid on back-surface electrode layer 4 with the conductive tapes adhered thereon, and provisional compression-bonded was performed above from bus bar 11 under the conditions of a temperature of 80° C., a pressure of 3 MPa, and a duration of two seconds. In addition, main compression-bonding was performed above from bus bar 11 under the conditions of a temperature of 160° C., a pressure of 3 MPa, and a duration of eight seconds. Here, a pulse heater was used in the provisional compression-bonding and the main compression-bonding.

It should be noted that the above-noted conductive tape includes nickel particles with a mean particle size of about 2 μm as metal particles. Bus bar 11 including a copper foil having a thickness of 100 μm as conductor 9 and tin plating as plating 10 was used here. Here, the plating thickness of plating 10 was set to 40 μm. Thin film solar cell 12 was fabricated through the procedure as described above.

Back-surface sealing material 14 was bonded to the back surface side (that is, the side on which the back-surface electrode layer was formed) of the resulting thin film solar cell 12 by a vacuum laminating apparatus using transparent EVA as adhesive material 13. A laminated film of white PET/aluminum/PET was used as back-surface sealing material 14. A solar cell in accordance with Example 1 was fabricated through the procedure as described above.

For the resulting solar cell, a high temperature high humidity storage test and a temperature humidity cycling test were carried out as reliability tests. The reliability tests were performed under the condition according to IEC 61646. In each test, no problem was found with output variations and appearance changes of the solar cell.

Example 2

A solar cell for tests was fabricated through the same procedure as Example 1 except that aluminum having a thickness of 150 μm was formed as back-surface electrode layer 4. The reliability tests were carried out by the same method as Example 1, and no problem was found in output variations and appearance changes.

Example 3

The same method as Example 1 was followed up to formation of back-surface electrode layer 4, and the glass substrate was cut into a size of about 30 mm square. A bus bar was bonded to this by the same method as Example 1, resulting a sample for a tensile test. A tensile strength at an angle of 45 degrees was measured using a tensile tester for 50 samples. A mean value of tensile strength of 50 samples and a standard deviation as variations of tensile strength of 50 samples were calculated. The mean value and variations of tensile strength were 3.1 and 0.61, respectively, where the mean value and variations in Comparative Example described later were each 1.

Comparative Example 1

The same method as Example 1 was followed up to formation of back-surface electrode layer 4, and the glass substrate was cut into a size of about 30 mm square. A bus bar was bonded by the same method as Example 1 except that silver paste that is conductive paste was applied about 10 μm thick in place of adhering a conductive tape, resulting a sample for a tensile test. A tensile strength at an angle of 45 degrees was measured for 50 samples, and the mean value and variations of tensile strength were calculated for 50 samples.

Examples 4, 5

In Example 4 and Example 5, bus bars different in flatness of the surface connected with the conductive tape were used to evaluate the bonding state between the back-surface electrode layer and the bus bar.

In Example 4, a bus bar with a flatness of 20 μm, which was measured through cross-sectional observation by a scanning electron microscope, was used. In Example 5, a bus bar with a flatness of 10 μm measured by the foregoing method was used. In each of Examples 4 and 5, a thin film solar cell was fabricated by the same method as Example 1. In each of the resulting thin film solar cells, the distance between the bus bar and the back-surface electrode layer was measured at 15 points of the bonded surface between the bus bar and the back-surface electrode layer. In addition, the bonding state between the bus bar and the back-surface electrode layer was observed through cross-sectional observation by a scanning electron microscope.

The bonding states between the bus bar and the back-surface electrode layer in Examples 4, 5 were confirmed through cross-sectional observation by a scanning electron microscope. In Example 4, as shown in FIG. 4, pressure was not evenly exerted on the conductive tape, so that the conductive tape partially did not penetrate into between the back-surface electrode layer and the but bar. On the other hand, in Example 5, as shown in FIG. 5, the entire surface of the bus bar was bonded to the back-surface electrode layer with the conductive tape interposed.

The results as described above showed that when the flatness of that surface of the bus bar which was connected with the conductive tape was 20 μm or more, a region where the bus bar and the back-surface electrode layer were not connected with each other appeared in part of the portion having the conductive tape, but when the flatness was 10 μm or less, the bonding by the conductive tape was effected more perfectly.

The embodiment and examples disclosed here should be understood as being illustrative rather than limiting in all respects. The scope of the present invention is shown not by the foregoing description but by the claims, and it is intended that the equivalency to the claims and all the modifications within the claims should be embraced here.

INDUSTRIAL APPLICABILITY

A thin film solar cell provided by the present invention may suitably be applied, for example, as an integrated solar cell for such uses as building integrated thin film solar cells and see-through solar cells.

The invention claimed is:

1. A thin film solar cell comprising: a light-transmitting insulating substrate; a transparent conductive film, a photoelectric conversion layer, and a back-surface electrode layer provided on said light-transmitting insulating substrate; and a bus bar provided on said back-surface electrode layer,
   wherein said bus bar is electrically connected with said back-surface electrode layer with a conductive tape interposed whereby said back-surface electrode layer is used as a take-out electrode,
   wherein said conductive tape includes a thermosetting resin and a conductive particle, and
   wherein said thermosetting resin comprises an epoxy resin or an acrylic resin and has a setting temperature in a range of 150-250° C.

2. The thin film solar cell according to claim 1, wherein said conductive tape is an anisotropic conductive tape.

3. The thin film solar cell according to claim 1, wherein said conductive tape is arranged in a dotted manner.

4. The thin film solar cell according to claim 1, wherein a width of said conductive tape is made smaller than a width of said bus bar.

5. The thin film solar cell according to claim 1, wherein said bus bar is formed of a conductor of a metal foil coated with plating.

6. The thin film solar cell according to claim 1, wherein a flatness of that surface of said bus bar which is connected with said conductive tape is less than or equal to 10 μm.

* * * * *